United States Patent [19]
Dickens et al.

[11] 4,232,277
[45] Nov. 4, 1980

[54] MICROWAVE OSCILLATOR FOR MICROWAVE INTEGRATED CIRCUIT APPLICATIONS

[75] Inventors: Lawrence E. Dickens, Baltimore; Douglas W. Maki, Arnold, both of Md.

[73] Assignee: The United States of America as represented by the Secretary of the Army, Washington, D.C.

[21] Appl. No.: 19,193

[22] Filed: Mar. 9, 1979

[51] Int. Cl.³ .......................... H03B 7/14; H03B 9/14
[52] U.S. Cl. .............................. 331/107 DP; 330/4.9; 331/107 SL; 333/230
[58] Field of Search ............ 331/96, 107 DP, 107 SL, 331/107 G; 330/4.9; 333/227, 230

[56] References Cited
U.S. PATENT DOCUMENTS 3,842,360  10/1974  Dickens ................................. 330/4.9
3,868,588  2/1975  Schwartzmann et al ...331/107 SL X
3,996,529  12/1976  Curtice ...................... 331/107 SL X Primary Examiner—Siegfried H. Grimm
Attorney, Agent, or Firm—Nathan Edelberg; Jeremiah G. Murray; Bernard Franz

[57] ABSTRACT

Disclosed is a means for obtaining a high Q oscillator which is compact and is adapted to be readily incorporated into known forms of microwave integrated circuits, e.g. a parametric amplifier. The oscillator which for example may comprise a pump oscillator for a parametric amplifier includes efficient means for coupling to microstrip without destroying the high Q of the oscillator circuit. The negative resistance elements which may be, for example, a Gunn diode, IMPATT diode or the like is located in a resonator cavity which is a combination of radial transmission line cavity and a rectangular waveguide cavity.

15 Claims, 13 Drawing Figures

FIG.12
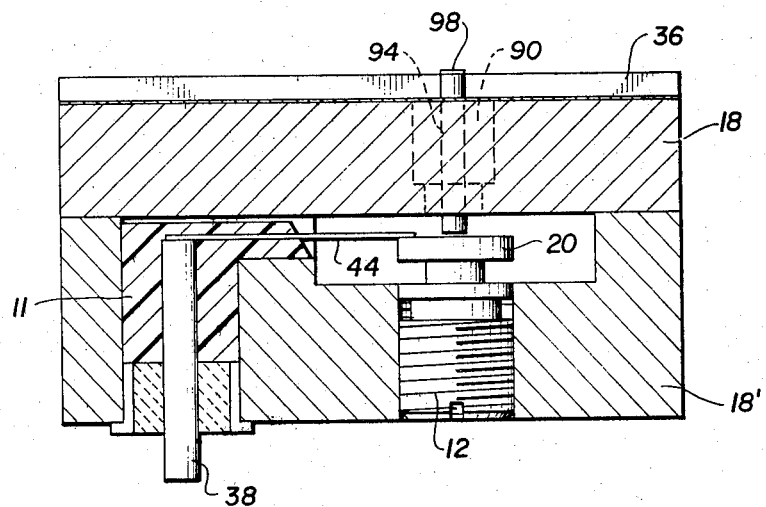
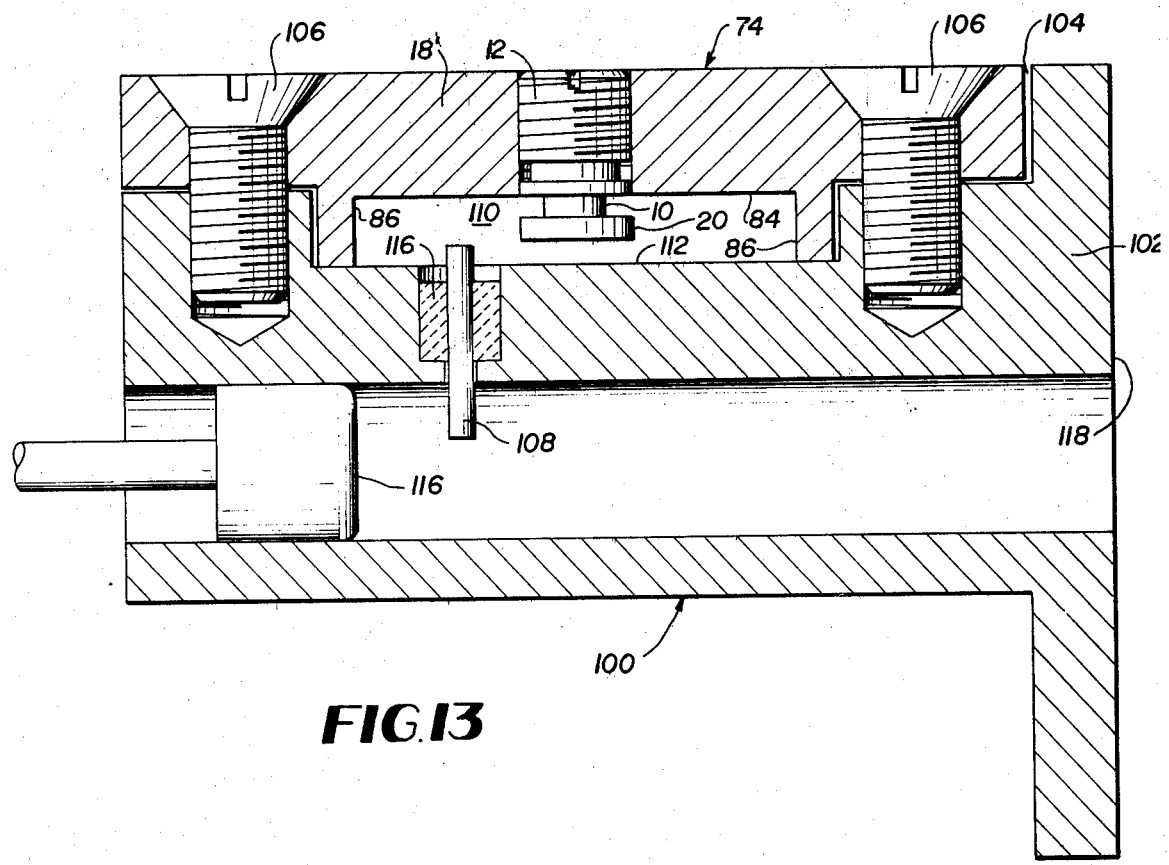
FIG.13

MICROWAVE OSCILLATOR FOR MICROWAVE INTEGRATED CIRCUIT APPLICATIONS

The invention described herein may be manufactured and used by or for the Government for governmental purposes without the payment of any royalties thereon or therefor.

BACKGROUND OF THE INVENTION

This invention relates generally to microwave oscillators and more particularly to a microwave oscillator utilized in a microwave integrated circuit configuration.

Prior art forms of microwave oscillators utilizing semiconductor negative resistance elements particularly adapted for use in microwave integrated circuits such as disclosed in U.S. Pat. No. 3,842,360 entitled "Parametric Amplifier", L. E. Dickens have had an inherent limitation due to the fact that excessive circuit losses prohibit the attainment of a reasonable quality Q factor and thus the ability to obtain a relatively narrow bandwidth resonance is lacking. For example, the unloaded Q of conventional resonant elements in microwave integrated circuits formed on alumina substrates, having thicknesses in the order of 0.025 in., typically are in the range of 100–300 for operational frequencies in the 1–10 GHz range. For very narrow oscillation line widths, however, the required loaded Q may exceed 1000. Thus the loaded Q requirements of a microwave oscillator of the type referred to above exceeds the unloaded Q capability and thus a fundamental incompatability results.

SUMMARY

It is an object of the present invention, therefore, to provide a new and improved microwave oscillator for microwave integrated circuit applications.

It is another object of the present invention to provide a unique and convenient means for attaining a high Q required for very narrow oscillation line widths.

Still another object of the present invention is the provision of a unique and convenient means for sufficiently coupling microwave energy from a high Q oscillator cavity to microwave integrated circuitry.

Yet another object of the present invention is the provision of a simple and convenient means for supplying bias power to the negative resistance element of a high Q oscillator in such a manner as to avoid low frequency instabilities frequently manifested by high level noise in the output, bias circuit oscillations, and diode burn out at low bias levels.

These and other objects of the present invention are attained by means of, preferably, a dual resonator cavity configuration formed in a metal substrate in which a packaged semiconductor negative resistance element is embedded. The resonator cavity comprises a radial transmission line cavity section and a rectangular waveguide cavity section operating in a TE010N mode. Microwave energy coupling is achieved by a microstrip to slot line to rectangular cavity transition or alternatively to a microstrip to coaxial line to rectangular cavity transition. Bias potential is applied by circuit means comprising the combination of a conductive lead forming one conductor of an inductive choke situated in lossy dielectric load material and arranged so as to present a very high impedance to the circulating currents of the microwave circuit in order to provide a predictable margin of stability against low frequency bias circuit oscillations.

BRIEF DESCRIPTION OF THE DRAWINGS

FIG. 12 is a transverse cross sectional view of the embodiment shown in FIG. 10 taken along the line 12—12; and FIG. 13 is a cross sectional view for a test mount for the oscillator configuration shown in FIGS. 9 through 11.

DESCRIPTION OF THE PREFERRED EMBODIMENTS

Figure 1:
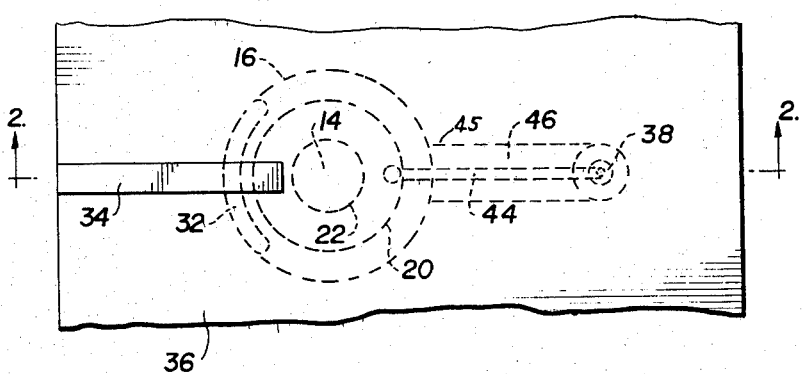
FIG. 1 is a fragmentary top planar view of a first embodiment of the present invention.
Figure 2:
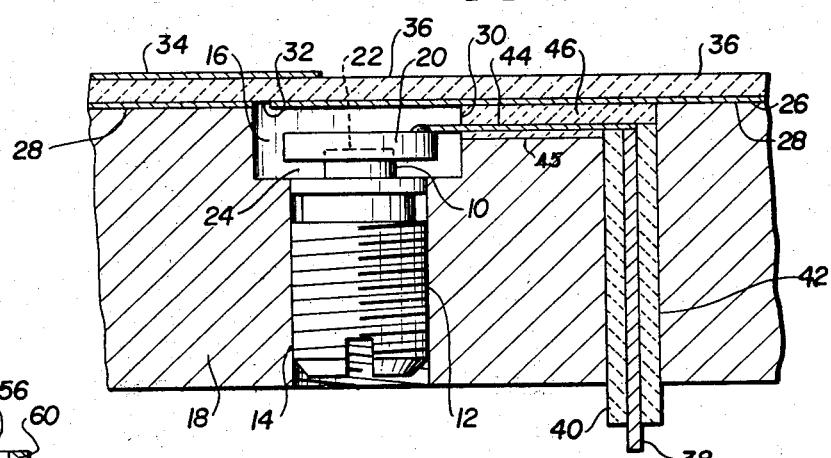
FIG. 2 is a longitudinal cross sectional diagram of the embodiment shown in FIG. 1 taken along lines 2—2.

Referring now to the drawings wherein like reference numerals refer to like components throughout, reference is first made collectively to FIGS. 1 and 2 which constitutes a first or basic embodiment of the present invention. Whereas FIG. 1 discloses the plan view and FIG. 2 discloses a cross sectional view of the same embodiment, reference numeral 10 designates a package assembly for microwave applications mounted on a screw threaded metal base 12 which is adapted to be screwed into a threaded bore 14 so that the diode assembly 10 projects upwardly into a circular cavity 16 machined into a metal body in the form of a substrate 18. The package assembly 10 contains an IMPATT diode, GUNN diode or the like adapted for operation as the negative resistance element of a microwave oscillator circuit. A circular metal disc 20 having a circular bore 22 formed in its underside is located on the top of diode assembly 10. The metal disc 20 comprises a resonator element which results in a radial transmission line cavity being formed in the vicinity of the diode assembly 10.

On the upper surface 26 of the metal substrate 18, there is located a microstrip ground plane 28 which is adapted to cover the cavity 16, making intimate contact with the cavity wall 30 and providing the top wall of the cavity. An arcuate slot 32 (FIG. 1) is provided in the ground plane 28 so that microwave energy generated within the radial transmission line cavity 16 can be coupled to a length of microstrip conductor 34 located on the top side of an alumina substrate 36 which is continuous with the microstrip ground plane 28.

Bias for the microwave diode, not shown, in the assembly 10 is coupled thereto by means of the center conductor 38 of a coaxial feedthrough conductor 40 which is inserted through a bore 42 formed in the metal substrate 18 substantially parallel with the threaded bore 14. The inner end of the center conductor 38 connects to a fine wire element 44 located in a channel 45 which is attached to the top of the resonator disc 20 as shown in FIG. 2. In addition to making a DC connection to the resonator disc 20, the fine wire element 44 acts as a high impedance RF choke to prevent RF energy from being fed back from the cavity 16 to the bias source, not shown, via the coaxial conductor 40. A lossy potting material 46 comprising, for example, a composition of iron and epoxy fills the channel 45 and is used to stake the wire element 44 and to present an RF load such that a high degree of isolation is maintained between the cavity 16 and the conductor 38 which is connected back to the bias source.

Figure 3:
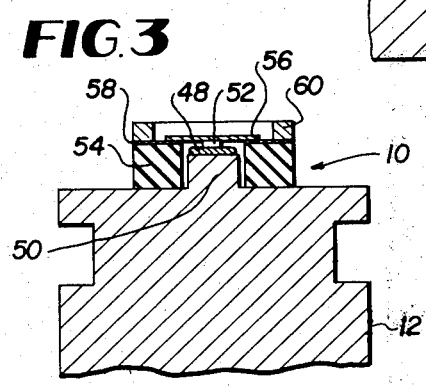
FIG. 3 is a fragmentary cross sectional view of the diode assembly which forms a part of the subject invention.

Referring now to FIG. 3, there is shown a cross section of the details of the packaged diode assembly 10 shown in FIG. 1. The diode assembly 10 includes, first of all, a gold plated heat sink 48 situated on a pedestal portion 50 of the threaded metal base 12. A microwave semiconductor diode 52 e.g. a gallium arsenide IMPATT or GUNN diode is bonded to the heat sink 48. An alumina ring 54 surrounds the pedestal portion 50 and a flat solid gold disc 56 is used for making contact of the alumina ring and to the diode 52. A layer of metallization 58 provides an electrical contact surface between the gold disc 56 and the top of the alumina ring 54. Next a Kovar ring 60 is placed atop of the alumina ring 54 so as to provide a common outer surface for contacting the bore 22 of the metal disc resonator 20. The Kovar ring 60 is thus used as a contact surface to the package and yields a structurally and electrically sound contact for receiving bias potential via the wire element 44 and the disc resonator 20. The package thus configured acts as a radial transmission line capacitively loaded by the diode 52 at its center.

Figure 4:
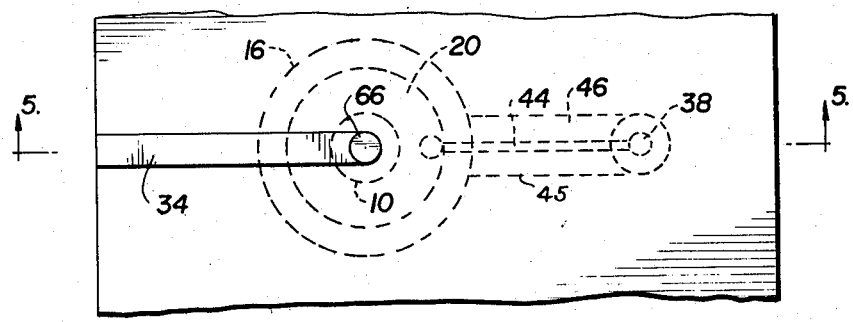
FIG. 4 is a fragmentary top plan view of a second embodiment of the subject invention.
Figure 5:
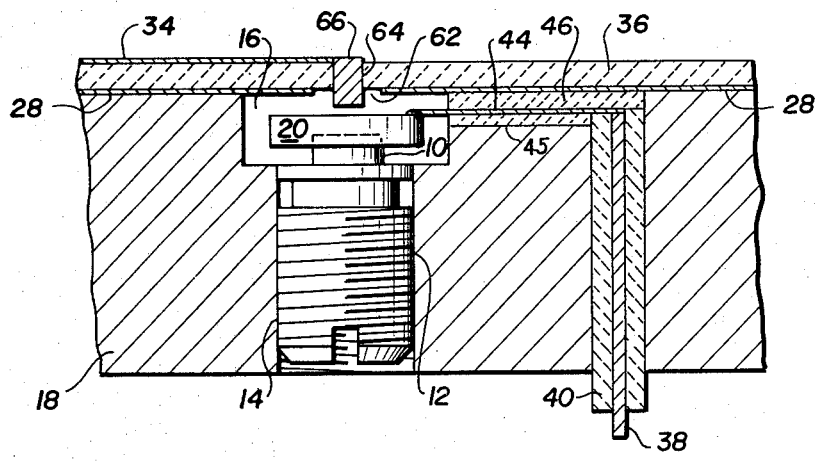
FIG. 5 is a longitudinal cross section of the embodiment shown in FIG. 4 taken along the lines 5—5.

Referring now to FIGS. 4 and 5, there is disclosed an embodiment of the present invention which is substantially identical to the embodiment shown in FIGS. 1 and 2 with the exception that the means for coupling energy out of the cavity 16 is different. In this embodiment, an area 62 is opened in the ground plane 28 and a centrally located hole 64 is formed through the alumina substrate 36. As can be seen from FIG. 5, the opening 62 and the hole in the substrate 36 is axially aligned with the central axis for the packaged diode assembly 10 and the disc resonator 20. A metallic pin 66 electrically connected to the microstrip conductor 34 is located in the hole 64. The pin 66 protrudes into the volume of the cavity 16 and performs the role of an E field coupling probe with the penetration of the pin producing the required load coupling.

Figure 6:
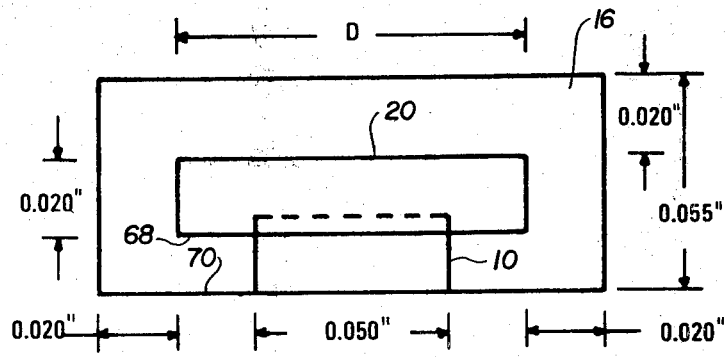
FIG. 6 is generally illustrative of the radial transmission line cavity configuration for the embodiments shown in FIGS. 2 and 4.

Referring now to FIG. 6, there is disclosed typical dimensions for the cavity 16. As shown, the outside diameter of the diode assembly 10 which includes the alumina ring 54 and the Kovar ring 60 (FIG. 3) is 0.050 inches. The metallic disc resonator element 20 is shown to have an outside diameter of D. The figure further indicates that a typical disc to wall separation of 0.020 inches exists all around except for the cavity height set at 0.015 inches by the lower surface 68 of the resonator element 20 and the bottom surface 70 of the cavity 16.

Figure 7:
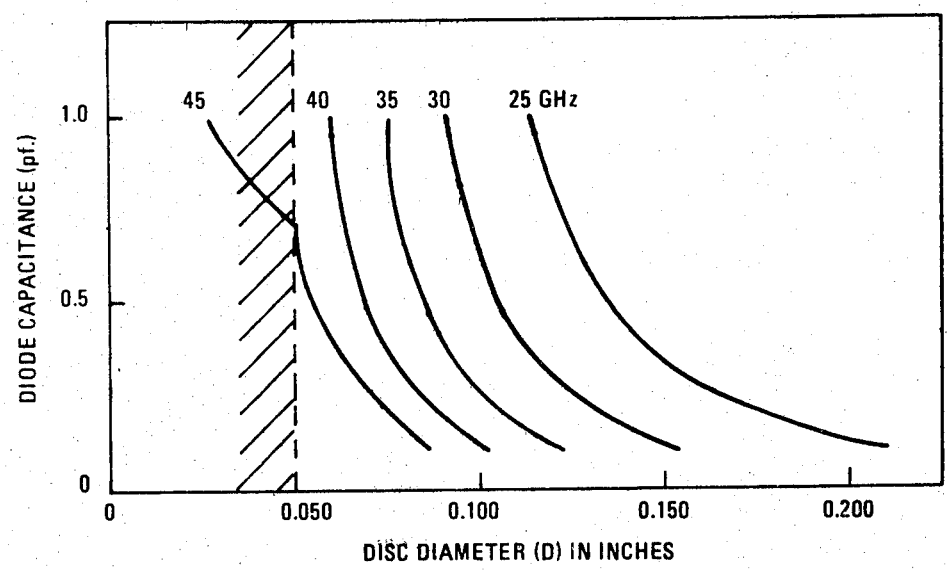
FIG. 7 is a set of curves illustrative of the relationship of capacitance vs. diameter of the resonating disc element utilized in connection with the radial transmission line cavity for a plurality of operating frequencies.

As to the outside diameter D of the disc resonator 20, reference to FIG. 7 discloses a set of curves for effecting resonance of any diode junction capacitance in the range of 0.1 pf to 1.0 pf for any frequency in the range of 25 GHz to 45 GHz. The lower limit for D is shown to be 0.05 inches, which is the outside diameter of the diode assembly 10 shown in FIG. 6 and is represented in FIG. 7 by the shaded area to the left of the D value of 0.050 inches. Thus, for example, with a specific diode package selected, if a sampled diode junction has a junction capacitance of 0.15 pf, it will require a resonator disc having a diameter of D=0.104 inches for resonance at 37 GHz.

While the oscillator structures considered up to this point operate as intended when coupled heavily enough to an RF load including the stripline element 34 and the required efficiency is attained, they nevertheless exhibit a relatively low value of loaded Q. However, a reasonably efficient coupling will yield a loaded Q of 15–20, which in some applications, may not be high enough to ensure oscillator stability and spectral purity.

Figure 8:
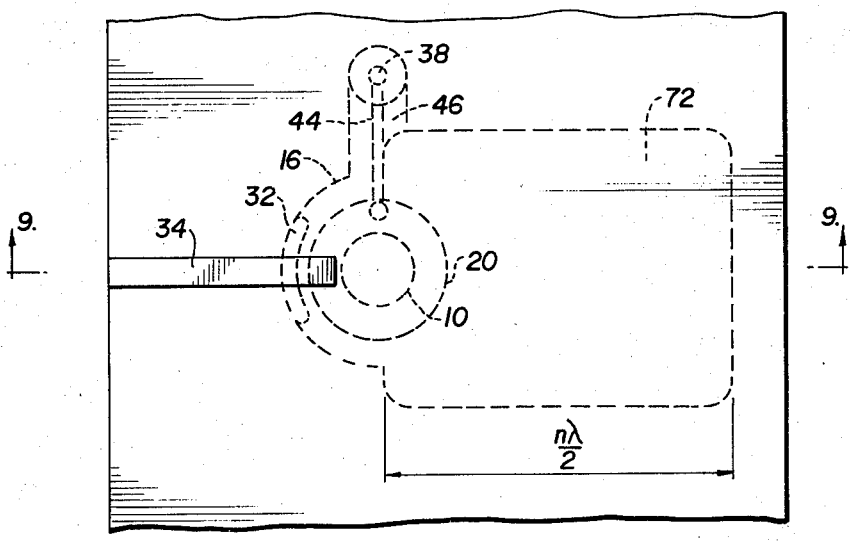
FIG. 8 is a fragmentary top planar view of a third embodiment of the subject invention.
Figure 9:
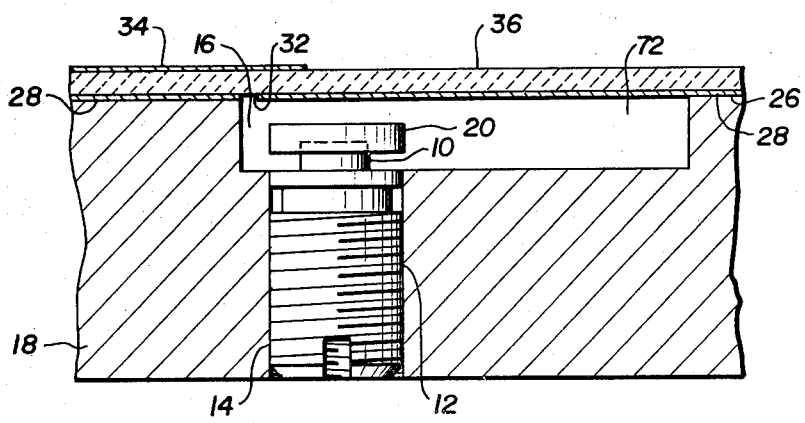
FIG. 9 is a longitudinal cross sectional view of the embodiment shown in FIG. 8 taken along the lines 9—9.

In order to improve the Q factor of the subject oscillator configurations considered up to now, the embodiment shown in FIGS. 8 and 9 may be resorted to which essentially consists in adding another cavity section in the form of a stabilizing cavity 72 to the basic oscillator cavity 16 described above in such a manner that a stabilizing factor of 50–100 can be realized. The stabilizing cavity 72 takes the form of an $n\lambda/2$ wavelength short circuited section of rectangular waveguide adapted to operate in a TE010N mode and being formed by an extension of the basic cavity 16 milled into the upper surface 26 of the metal substrate 18 and being closed at the top by the microstrip ground plane 28. The degree of coupling between the stabilizing cavity 72 and the basic oscillator cavity 16 determines the overall cavity loaded Q and thus the stabilization ratio. As can be seen by reference to FIG. 8, the stabilizing cavity is generally rectangular in configuration and oriented such that the shorter dimension is joined at the semi-circular dimension of the cavity 16 in line with the wire element 44. The longer dimension of the rectangular cavity has a length substantially $n\lambda/2$ and lies substantially parallel to the output microstrip conductor 34 while being substantially perpendicular to the wire element 34 and the channel including the RF loading material 46.

Figure 10:
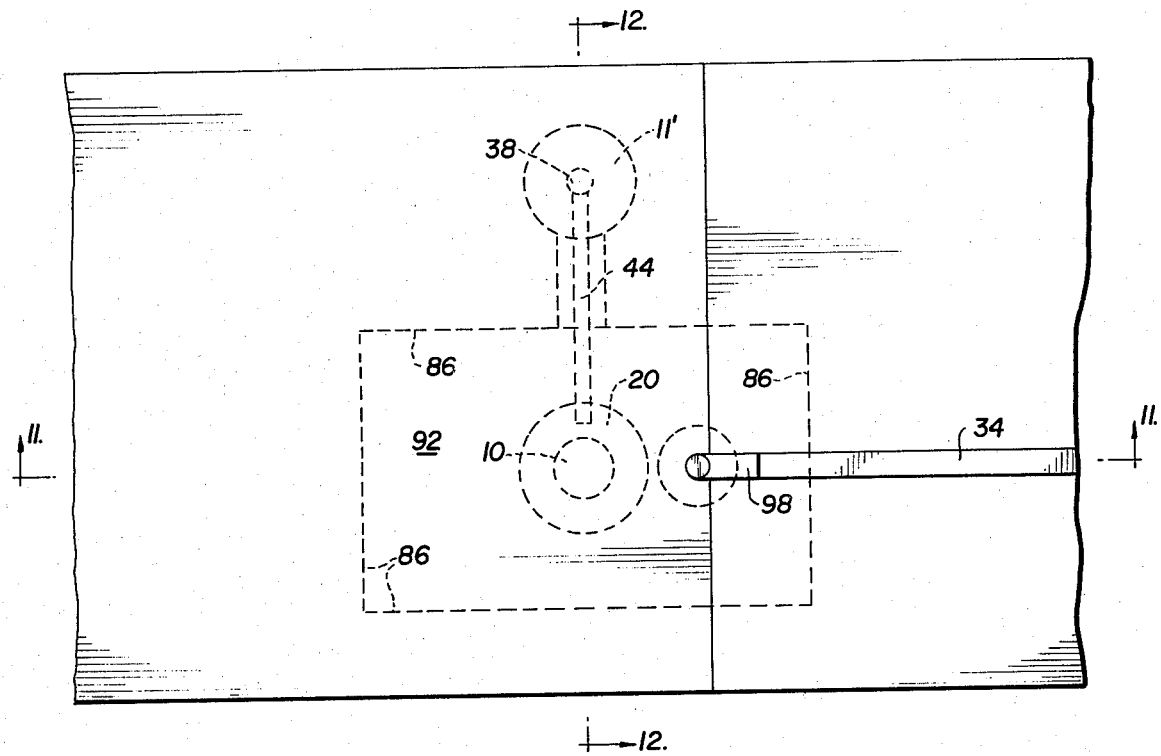
FIG. 10 is a fragmentary top planar view of a fourth and preferred embodiment of the subject invention.
Figure 11:
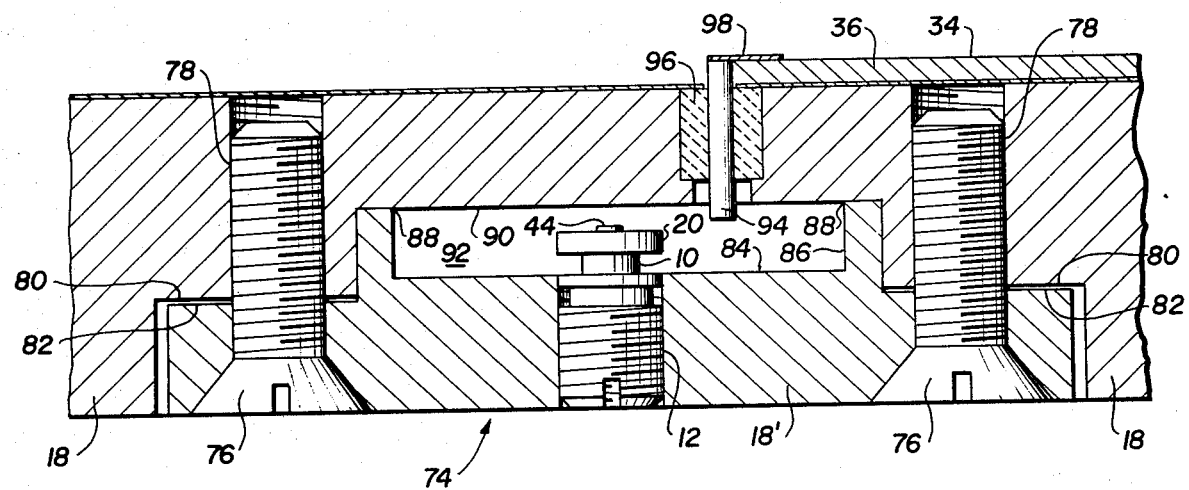
FIG. 11 is a longitudinal cross section of the embodiment shown in FIG. 10 taken along the lines 11—11.

Referring now to a third and preferred embodiment of the subject invention, reference is now made to FIGS. 10 through 12 which include features of the two previously considered embodiments, as well as additional features to be described. In the present embodiment, a separable body portion 74 of the oscillator is adapted to form a substrate 18' and engage and be held in place in the metal substrate 18 by screw member 76. The metal substrate 18' is adapted to fit in a recess 78 of the substrate 18 which includes a shoulder portion 80 which is adapted to receive the shoulder 82 of the substrate 18' with a screw member 76 therethrough providing the required retention. When in position, the substrate 18' forms an integral part of the total microwave integrated circuit structure. It should also be pointed out that the substrate 18' contains a recess consisting of a bottom wall 84 and four side walls 86 (FIG. 10) which terminate in upper edges 88 (FIG. 11) which edges constitute the interface between it and the metal substrate 18. When the substrate 18' is in place, the bottom wall 84, four side walls 86 and the bottom wall 90 of the substrate 18 forms a generally rectangular cavity structure 92 which is adapted to include both a radial resonator cavity portion and a stabilizing cavity portion. The package diode assembly 10 in this embodiment is mounted on the screw base 12 and is centrally located within the cavity structure 92. The external RF load including the microstrip transmission line 34 is coupled to the RF fields of the cavity 92 by an E field coupling probe element 94 held in position off to the side of the disc resonator 20 by means of a dielectric sleeve member 96. The probe 94 is externally coupled to a flat conductor member 98 which is electrically bonded to the output microstrip transmission line 34. As shown in FIGS. 10 and 12, bias potential is applied to the diode, not shown, in the assembly 10 by way of the same type of coaxial feedthrough including the center conductor 38 which connects to the fine wire element 44. As in the other embodiments the wire 44 makes a DC connection to the resonator disc 20 while also acting as a high impedance RF choke. A configuration 11' of potting material consisting of iron-epoxy fills a bore/channel configuration 45' and is used to stake the wire element 44 and the inner conductor 38 as well as presenting an RF load such that isolation is maintained between the cavity 92 and the bias potential source, not shown.

An important feature of the embodiment shown in FIGS. 10 through 12 is that the oscillator body portion 74 is demountable from the metal substrate 18 for separate testing. This testing is most easily accomplished in a test mount configuration 100 shown in FIG. 13 which has a conventional rectangular waveguide output and is connected to a standard waveguide oscillator parameter measurement test set up, not shown. The test mount consists of a waveguide body 102 which includes a recess or bore 104 for receiving the substrate 18' in the same manner as shown in FIG. 11; however, the orientation of the oscillator body portion 74 is shown reversed in FIG. 13. As in the working environment, the substrate 18' is held in place by screw members 106. A coupling probe 108 couples the cavity 110 formed by the walls 84, 86 and 112 to the output waveguide channel 114 and is supported by a dielectric bead 116. A slidable RF waveguide tuner element 116 is used in conjunction with the probe 108 to effect the desired degree of coupling between the waveguide channel 114 and the cavity 110. The output waveguide channel 114 terminates in a flange 120 for being connected to the waveguide test circuitry, not shown.

Thus what has been shown and described is a microwave oscillator which is particularly adapted to be used as a pump oscillator for an integrated parametric amplifier utilizing microstrip to slot line transition techniques such as shown and described in the aforementioned U.S. Pat. No. 3,842,360.

While there has been shown and described what is at present considered to be the preferred embodiments of the invention, modifications thereto will readily occur to those skilled in the art. It is not desired, therefore, that the invention be limited to the specific arrangements shown and described, but it is to be understood that all equivalents, alterations and modifications coming within the scope of the present invention are herein meant to be included.

We claim as our invention:

1. A microwave oscillator utilizing a semiconductor negative resistive device and being particularly adapted for microwave integrated circuit applications such as the pump oscillator for a parametric amplifier comprising, in combination:

a metal body in the form of a planar substrate configuration having resonator cavity means formed therein and having a surface over which is formed a microstrip ground plane, said metal body additionally having a bore therein extending to said resonator cavity means;

a mounting base including a semiconductor assembly, including a semiconductor device adapted to operate as a negative resistive element mounted on one end of said base and being inserted in said bore with said semiconductor assembly extending into said cavity means while said base is fastened to said metal body;

wherein said cavity means includes a radial resonator cavity section formed by a metallic disc resonator element electrically coupled to and being secured to the top portion of said semiconductor assembly within said resonator cavity means;

means included in said metal body and coupled to said semiconductor assembly for applying electrical power to said semiconductor device for operating said device as a negative resistance element;

a non-metallic substrate formed on said metal body over said ground plane;

a length of microstrip conductor formed on the outer surface of said non-metallic substrate extending from a region remote from the locality of said cavity means to a region proximate thereto; and means coupling microwave energy from said cavity means to said length of microstrip conductor.

2. The microwave oscillator as defined by claim 1 wherein said cavity means additionally includes a stabilizing cavity section.

3. The microwave oscillator as defined by claim 2 wherein said radial resonator cavity section and said stabilizing cavity section are formed in one surface of said metal body beneath said ground plane.

4. The microwave oscillator as defined by claim 2 wherein said stabilizing cavity section is configured as an $n\lambda/2$ wavelength short circuited section of rectangular waveguide adapted for operation in a TE010N mode.

5. The microwave oscillator as defined by claim 4 wherein said radial resonator cavity section and said stabilizing cavity section adjoin one another and wherein said radial resonator cavity section is generally circular and said stabilizing cavity section is generally rectangular, having a lengthwise dimension of $n\lambda/2$ which extends away from said radial resonator cavity section.

6. The microwave oscillator as defined by claim 1 wherein said length of microstrip conductor extends to a region over said cavity means and wherein said microwave energy coupling means comprises a slot formed in said microstrip ground plane intermediate said cavity means and said length of microstrip conductor.

7. The microwave oscillator as defined by claim 1 wherein said length of microstrip conductor extends to a region over said cavity means and wherein said microwave energy coupling means comprises a metallic probe connected to said length of microstrip conductor extending through a hole formed in said microstrip ground plane and extending into said cavity means.

8. The microwave oscillator as defined by claim 7 wherein said coupling probe is centrally located over said metallic disc resonator element.

9. The microwave oscillator as defined by claim 7 wherein said cavity means is generally rectangular in configuration and wherein said radial resonator cavity section is centrally located in said generally rectangular configuration and said probe is offset from said metallic disc resonator element.

10. The microwave oscillator as defined by claim 9 wherein said generally rectangular configuration also includes a surrounding stabilizing cavity section configured as an nλ/2 wavelength short circuited section of rectangular waveguide.

11. The microwave oscillator as defined by claim 10 wherein said radial resonator cavity section and said stabilizing cavity section are integrally formed by connected non-removable and removable portions of said metal body and wherein said bore for said mounting base is located in the removable portion.

12. The microwave oscillator as defined by claim 11 wherein said non-removable portion is adapted to form the top wall of said cavity means while said removable portion is adapted to form the side and bottom walls of said cavity means.

13. The microwave oscillator as defined by claim 11 wherein said means for applying power to said semiconductor device includes a wire embedded in electrically lossy material located in said non-removable portion of said metal body and being operable to form a relatively high impedance choke circuit for circulating currents within said cavity and electrical circuit means for applying electrical power to said wire.

14. The microwave oscillator as defined by claim 1 wherein said means for applying electrical power to said semiconductor device comprises a channel in said body including electrically lossy potting material therein within which is located a length of electrical wire electrically connected to said metallic disc resonator element forming a relatively high impedance RF choke, and isolation circuit thereby, and means coupled to said length of electrical wire for applying a supply potential to said length of electrical wire.

15. The microwave oscillator as defined by claim 1 wherein said semiconductor device comprises a microwave diode.

* * * * *